United States Patent
Wang et al.

(10) Patent No.: US 12,198,936 B2
(45) Date of Patent: Jan. 14, 2025

(54) DEFECT FREE GERMANIUM OXIDE GAP FILL

(71) Applicant: Applied Materials, Inc., Santa Clara, CA (US)

(72) Inventors: Huiyuan Wang, Santa Clara, CA (US); Susmit Singha Roy, Campbell, CA (US); Takehito Koshizawa, San Jose, CA (US); Bo Qi, San Jose, CA (US); Abhijit Basu Mallick, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/242,082

(22) Filed: Sep. 5, 2023

(65) Prior Publication Data
US 2023/0407468 A1    Dec. 21, 2023

Related U.S. Application Data

(62) Division of application No. 17/119,648, filed on Dec. 11, 2020, now Pat. No. 11,781,218.

(51) Int. Cl.
*H01L 21/311* (2006.01)
*C23C 16/40* (2006.01)
(Continued)

(52) U.S. Cl.
CPC ...... *H01L 21/31111* (2013.01); *C23C 16/407* (2013.01); *C23C 16/45527* (2013.01); *C23C 16/56* (2013.01); *H01L 21/0228* (2013.01); *H01L 21/30604* (2013.01); *H01L 21/311* (2013.01); *H01L 21/31105* (2013.01); *H01L 21/76224* (2013.01); *H01L 21/76837* (2013.01)

(58) Field of Classification Search
None
See application file for complete search history.

(56) References Cited

U.S. PATENT DOCUMENTS 6,333,245 B1 * 12/2001 Furukawa ........... H01L 21/2255
                                                              438/542
6,475,865 B1    11/2002 Yang et al.
(Continued)

FOREIGN PATENT DOCUMENTS

| JP | H10290036 | * 10/1998 | ............... B81C 1/00 |
| JP | 2020136676 A | 8/2020 | |
| KR | 100313184 B1 | 11/2001 | |

OTHER PUBLICATIONS

W. Kern, "The evolution of silicon wafer cleaning technology", J. Electrochem. Soc., vol. 137, pp. 1881-1892. (Year: 1990).*
(Continued)

*Primary Examiner* — Jiong-Ping Lu
(74) *Attorney, Agent, or Firm* — Servilla Whitney LLC

(57) ABSTRACT

Methods for forming defect-free gap fill materials comprising germanium oxide are disclosed. In some embodiments, the gap fill material is deposited by exposing a substrate surface to a germane precursor and an oxidant simultaneously. The germane precursor may be flowed intermittently. The substrate may also be exposed to a second oxidant to increase the relative concentration of oxygen within the gap fill material. A process for removal of germanium oxide is also disclosed.

20 Claims, 3 Drawing Sheets

(51) Int. Cl.
  *C23C 16/455* (2006.01)
  *C23C 16/56* (2006.01)
  *H01L 21/02* (2006.01)
  *H01L 21/306* (2006.01)
  *H01L 21/762* (2006.01)
  *H01L 21/768* (2006.01)

(56) References Cited

U.S. PATENT DOCUMENTS

| | | |
|---|---|---|
| 9,218,963 B2 | 12/2015 | Matero |
| 2006/0178003 A1 | 8/2006 | Krishnaraj et al. |
| 2009/0181515 A1 | 7/2009 | Herner et al. |
| 2014/0120738 A1 | 5/2014 | Jung et al. |
| 2014/0273412 A1 | 9/2014 | Wu et al. |
| 2015/0076558 A1 | 3/2015 | Lee et al. |
| 2017/0069490 A1 | 3/2017 | Li |
| 2017/0114459 A1 | 4/2017 | Saly et al. |
| 2018/0061849 A1 | 3/2018 | Yamaguchi |
| 2020/0091319 A1* | 3/2020 | Bao .............. H01L 21/76205 |
| 2020/0135760 A1* | 4/2020 | Kim .............. H01L 21/67178 |

OTHER PUBLICATIONS

"Final Office Action in U.S. Appl. No. 17/119,655 dated Dec. 23, 2022, 14 pages".
"Non Final Office Action in U.S. Appl. No. 17/119,655 dated Sep. 7, 2022, 12 pages".
"PCT International Search Report and Written Opinion in PCT/US2021/062875 dated Apr. 7, 2022, 9 pages".
"PCT International Search Report and Written Opinion in PCT/US2021/062877 dated Apr. 7, 2022, 8 pages".

* cited by examiner

DEFECT FREE GERMANIUM OXIDE GAP FILL

CROSS-REFERENCE TO RELATED APPLICATIONS

The present application is a divisional of U.S. patent application Ser. No. 17/119,648, filed Dec. 11, 2020, issued as U.S. Pat. No. 11,782,218, the entire disclosure of which is hereby incorporated by reference herein.

TECHNICAL FIELD

Embodiments of the disclosure generally relate to methods for forming germanium oxide materials. In particular, embodiment of disclosure relate to methods for forming defect free germanium oxide gap fill.

BACKGROUND

Germanium oxide is an increasingly important material in semiconductor manufacturing. Germanium is group 14 element, like silicon, and so germanium containing materials often have similar properties as their silicon based analogs. Given the prevalence of silicon oxide in semiconductor manufacturing, there is an increased interest in germanium oxide, its properties and methods for forming germanium oxide materials in various processing schemes.

One scheme of interest is filling substrate features (e.g., vias, trenches, etc.) with gapfill material. Unfortunately, typical gapfill methods often result in gap fill materials which contain defects including seams and voids. The defects can cause multiple issues during downstream processing. The issues are often evidenced most clearly by etch processes which impact the defects differently than the surrounding gap fill. These defects can also cause deterioration of the pattern/device which contains the gap fill over time.

Accordingly, there is a need for novel methods of depositing gap fill which do not produce seams, voids or other defects within the deposited materials.

SUMMARY

One or more embodiments of the disclosure are directed to a method for depositing a gap fill material. The method comprises exposing a substrate surface comprising at least one feature to a germane precursor and a first oxidant to deposit a gap fill material comprising germanium oxide within the at least one feature. The at least one feature has an opening width and extends a depth into the substrate. The gap fill material has substantially no voids nor seam.

Additional embodiments of the disclosure are directed to a method for depositing a gap fill material. The method comprises exposing a substrate surface comprising at least one feature to a constant flow of a first oxidant and an alternating flow of a germane precursor and a second oxidant to deposit a gap fill material comprising germanium oxide within the at least one feature. The at least one feature has an opening width and extends a depth into the substrate. The germane precursor and the second oxidant each have a duty cycle of less than or equal to 25%. The gap fill material has substantially no voids nor seam.

Further embodiments of the disclosure are directed to a method of selectively removing germanium oxide. The method comprises exposing a germanium oxide layer to a basic aqueous solution.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Figure 1:
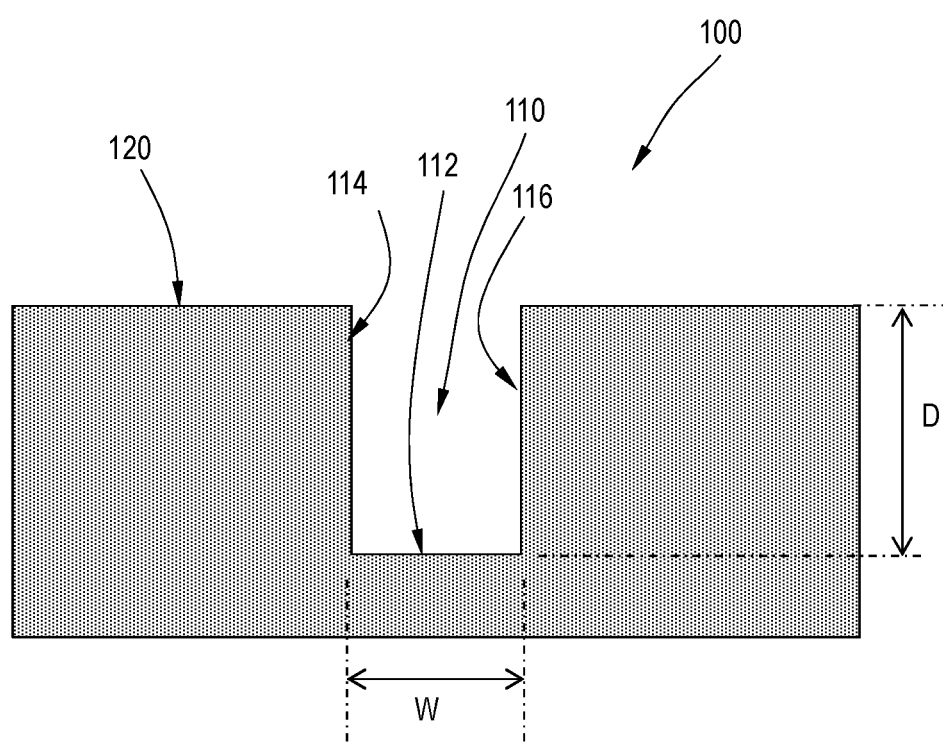
FIG. 1 illustrates an exemplary substrate with a feature before processing according to one or more embodiment of the disclosure.

FIG. 1 shows a cross-sectional view of a substrate 100 with a feature 110. The disclosure relates to substrates and substrate surfaces which comprise at least one feature. FIG. 1 shows a substrate 100 having a single feature 110 for illustrative purposes; however, those skilled in the art will understand that there can be more than one feature. The shape of the feature 110 can be any suitable shape including, but not limited to, trenches, cylindrical vias, or rectangular vias.

As used in this regard, the term "feature" means any intentional surface irregularity. Suitable examples of features include, but are not limited to trenches which have a top, two sidewalls and a bottom, and peaks which have a top and two sidewalls without a bottom. Features can have any suitable aspect ratio (ratio of the depth of the feature to the width of the feature) as discussed below.

The substrate 100 has a substrate surface 120. The at least one feature 110 forms an opening in the substrate surface 120. The feature 110 extends from the substrate surface 120 (also referred to as the top surface) to a depth D to a bottom surface 112. The feature 110 has a first sidewall 114 and a second sidewall 116. While the feature shown in FIG. 1 has parallel sidewalls 114, 116, the width of the feature is most often defined by the width W of the feature at the top opening of the feature 110; this measurement may also be referred to as the opening width. The open area formed by the sidewalls 114, 116 and bottom 112 are also referred to as a gap.

One or more embodiment of the disclosure is directed to methods for depositing a gap fill material with substantially no defects. Some embodiments of the disclosure deposit a gapfill material with substantially no seam(s). Some embodiments of the disclosure deposit a gapfill material with substantially no void(s). Some embodiments of the disclosure advantageously deposit the gap fill material without plasma. Some embodiments of the disclosure advantageously deposit the gap fill material without the use of a separate densification step.

One or more embodiment of the disclosure is directed to methods for depositing a super-conformal film. Some embodiments of the disclosure deposit a super-conformal film with a greater thickness on the sidewall and/or bottom than on the top surface. Some embodiments of the disclosure advantageously deposit the super-conformal film without plasma. Some embodiments of the disclosure advantageously deposit the super-conformal film without the use of a separate etch process.

Figure 2:
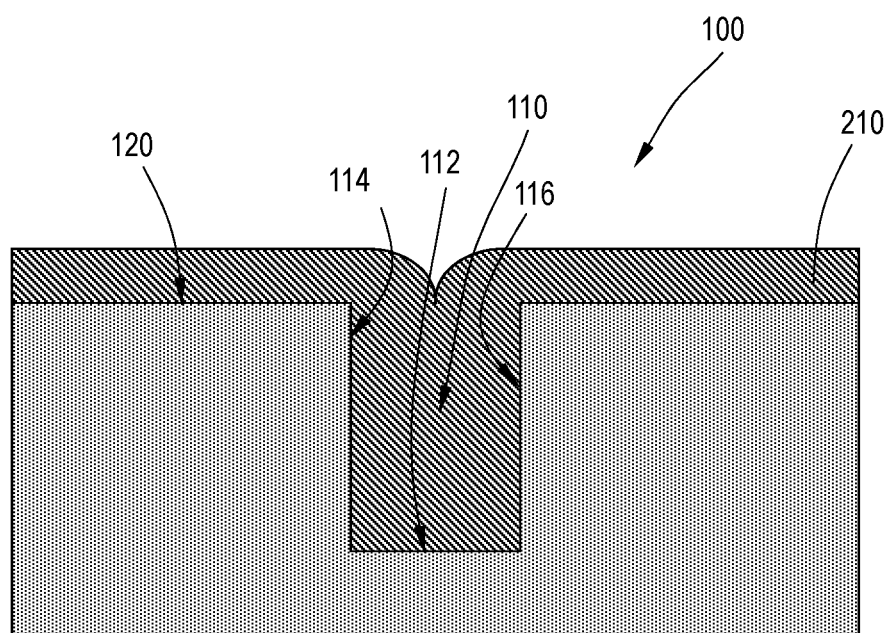
FIG. 2 illustrates an exemplary substrate after processing to form a gapfill material according to one or more embodiment of the disclosure.

Referring to FIG. 2, some embodiments of the disclosure relate to methods for depositing a gap fill material 210 within a feature 110 of a substrate 100. In some embodiments, the gap fill material 210 is substantially free of defects, including, but not limited to seams and voids. In some embodiments, the gap fill material 210 is substantially free of seams. In some embodiments, the gap fill material 210 is substantially free of voids.

As used in this specification and the appended claims, a seam is a gap or fissure that forms in the feature between, but not necessarily in the middle of, the sidewalls of the feature 110. Without being bound by theory, a seam may be formed when the lattice structures of films which have grown from the sidewalls of the feature do not harmonize as they meet near the center of the feature.

As used in this specification and the appended claims, a void is a vacant area in which the gap fill material 210 has not deposited within the feature 110. Without being bound by theory, voids often form when material deposits faster near the top of a feature and pinches closed the opening of the feature before the gap fill material can completely fill the feature. The remaining unfilled space is a void.

As used in this regard, the term "substantially free of seams" or "substantially free of voids" means that any crystalline irregularity or enclosed space without material formed in the space between the sidewalls of a feature is less than about 1% of the cross-sectional area of the feature.

Figure 3:
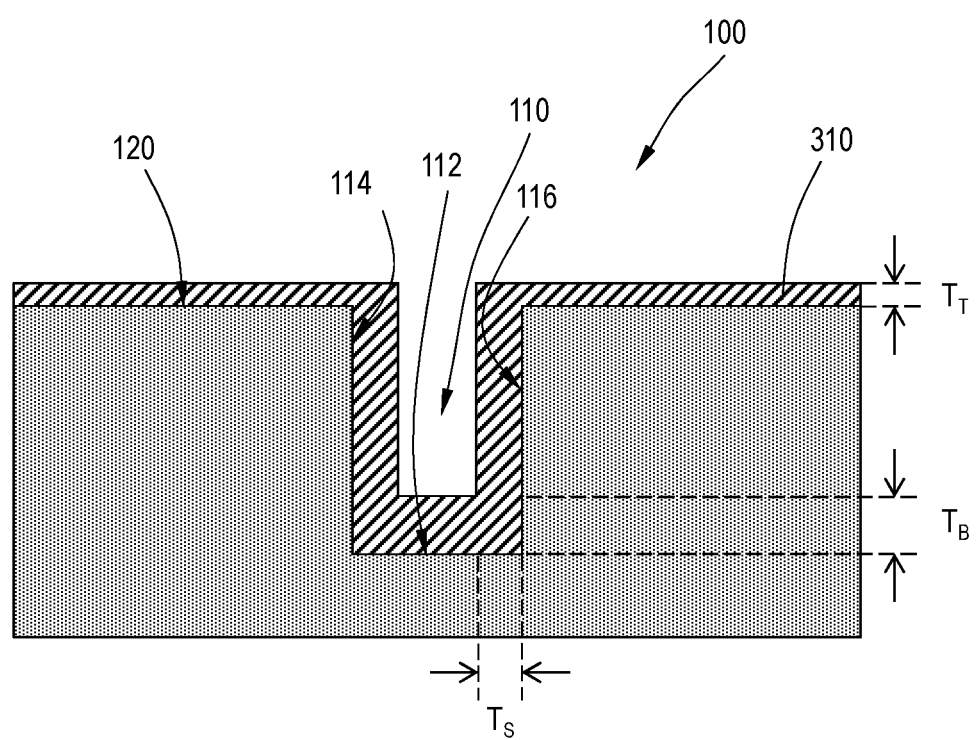
FIG. 3 illustrates an exemplary substrate after processing to form a super-conformal film according to one or more embodiment of the disclosure.

Referring to FIG. 3, some embodiments of the disclosure relate to depositing a super-conformal film 310 within a feature 110 of a substrate 100. The super-conformal film 310 has a sidewall thickness $T_S$ on the sidewalls 114, 116 and/or bottom thickness $T_B$ on the bottom surface 112 that is greater than the top thickness $T_T$ on the substrate surface 120 outside of the feature 110. In some embodiments, the ratio between $T_S$ and $T_T$ is greater than or equal to 1.2, greater than or equal to 1.5, greater than or equal to 2, greater than or equal to 3, or greater than or equal to 4. In some embodiments, the ratio between $T_B$ and $T_T$ is greater than or equal to 1.2, greater than or equal to 1.5, greater than or equal to 2, greater than or equal to 3, or greater than or equal to 4.

The methods for depositing the gap fill material 210 comprise exposing the substrate 100 and the substrate surface 120, including at least one feature 110, to a germane precursor and a first oxidant to deposit the gap fill material 210 within the feature 110. The gap fill material 210 comprises germanium oxide.

The methods for depositing the super-conformal film 310 comprise exposing the substrate 100 and the substrate surface 120, including at least one feature 110, to a germane precursor and a first oxidant to deposit the super-conformal film 310 within the feature 110. The super-conformal film 310 comprises germanium oxide.

The method for depositing the gap fill material 210 and the method of depositing the super-conformal film 310 are similar in several respects. The remainder of the disclosure provides additional details for these processes. Except where clearly identified, the details provided are relevant to both the deposition of the gap fill material 210 and the super-conformal film 310.

For deposition of the gap fill material 210, in some embodiments, the feature 110 has an opening width in a range of 10 nm to 30 nm, 10 nm to 20 nm, 15 nm to 30 nm, 20 nm to 30 nm or 25 nm to 30 nm. In some embodiments, the feature 110 has an aspect ratio (depth divided by opening width) in a range of 2 to 10, 2 to 5, or 5 to 10. In some embodiments, the aspect ratio is in a range of 2.5 to 3.5 or in a range of 7.5 to 8.5.

Without being bound by theory, it is believed that the gap fill material 210 is marginally flowable and susceptible to capillary forces when deposited on features with a narrower opening width. The narrower opening increases the likelihood that the gap fill material 210 will be drawn down, into the feature 110 to form a gap fill material 210 with substantially no seams or voids.

For deposition of the super-conformal film 310, in some embodiments, the feature 110 has an opening width in a range of 50 nm to 200 nm, 80 nm to 120 nm, 50 nm to 100 nm, or 100 nm to 200 nm. In some embodiments, the feature 110 has an aspect ratio (depth divided by opening width) in a range of 2 to 10, 2 to 5, or 5 to 10. In some embodiments, the aspect ratio is in a range of 4.5 to 5.5.

In contrast to the gap fill material 210, the super-conformal film 310 is typically deposited on features with a relatively wide opening width. This wider width decreases the capillary effect experienced by the super-conformal film 310 and allows the super-conformal film 310 to remain on each of the feature surfaces without flowing to the bottom of the feature 110.

The substrate 100 or the substrate surface 120 is exposed to the germane precursor and the first oxidant simultaneously. In this regard, one skilled in the art will understand that the germane precursor and the first oxidant will react in the gas phase to deposit the gap fill material 210 and/or the super-conformal film 310.

The germane precursor may comprise any suitable compounds for the deposition of a germanium oxide gap fill material. In some embodiments, the germane precursor comprises one or more of germane ($GeH_4$) and/or digermane ($Ge_2H_6$).

In some embodiments, the germane precursor further comprises hydrogen gas ($H_2$). In some embodiments, the ratio of hydrogen gas to germane is in a range of 5 to 20, 7 to 15 or 8 to 12. In some embodiments, the germane precursor consists essentially of 10% germane in hydrogen gas. As used in this regard, a process gas which "consists essentially of" a stated gas or mixture of gases comprises greater than 95%, greater than 98%, greater than 99% or greater than 99.5% of the stated gas or gasses on a molar basis, excluding any inert carrier or diluent gases.

The first oxidant may be any oxygen supplying compound capable of supplying oxygen atoms to the germanium oxide gap fill material. In some embodiments, the first oxidant comprises one or more of nitrous oxide ($N_2O$), oxygen gas ($O_2$), ozone ($O_3$) or water ($H_2O$). In some embodiments, the first oxidant consists essentially of nitrous oxide ($N_2O$).

In some embodiments, the ratio of the germane precursor and the first oxidant is controlled. In some embodiments, when depositing the gap fill material 210, the ratio of the first oxidant to the germane precursor is in a range of 5 to 200, 10 to 100, 10 to 50 or 30 to 50. In some embodiments, when depositing the super-conformal film 310, the ratio of the first oxidant to the germane precursor is in a range of 50 to 2000, 100 to 1000, 100 to 500 or 300 to 500.

In some embodiments, the substrate 100 or the substrate surface 120 is exposed to the first oxidant constantly and the germane precursor intermittently. Stated differently, in some embodiments, the methods are pulsed-CVD type methods where one reactant is flowed constantly and the other is pulsed at a regular interval into the chamber. In some embodiments, the substrate 100 or the substrate surface 120 is exposed to the first oxidant for a period before being exposed to the first oxidant and the germane precursor simultaneously.

If the germane precursor is flowed intermittently or pulsed, the percentage of time that the flow of germane precursor is active may be described as the duty cycle. In some embodiments, the duty cycle of the germane precursor is less than or equal to 50%, less than or equal to 33%, less than or equal to 25% or less than or equal to 10%.

The length of the deposition cycle may be any suitable length. In some embodiments, the cycle length is in a range of 10 seconds to 60 seconds, or in a range of 15 seconds to 50 seconds. Accordingly, the length of the germane precursor pulse is in a range of 1 second to 30 seconds.

In some embodiments, when the germane precursor is not flowing the substrate 100 or the substrate surface 120 is exposed to a second oxidant. In some embodiments, the first oxidant and the second oxidant are different in composition. In some embodiments, the second oxidant comprises one or more of nitrous oxide ($N_2O$), oxygen gas ($O_2$), ozone ($O_3$) or water ($H_2O$). In some embodiments, the first oxidant consists essentially of nitrous oxide ($N_2O$) and the second oxidant consists essentially of oxygen gas ($O_2$).

In some embodiments, the exposure time for the germane precursor and the second oxidant is approximately equal. In some embodiments, the germane precursor and the second oxidant are separated by periods of approximately the same length. In some embodiments, the substrate is exposed to a deposition cycle comprising a constant flow of the first oxidant, a germane precursor pulse for 25% of the deposition cycle, a first pause for 25% of the deposition cycle, a second oxidant pulse for 25% of the deposition cycle and a second pause for 25% of the deposition cycle.

In some embodiments, the method of depositing the gap fill material 210 is performed without the use of plasma. In some embodiments, the method of depositing the super-conformal film 310 is performed without the use of plasma. Stated differently, the methods of this disclosure are thermal processes where a plasma-based reactant is not present.

The pressure of the processing environment may also be controlled. In some embodiments, the methods are performed at a pressure in a range of 100 Torr to 500 Torr, in a range of 200 Torr to 500 Torr, in a range of 250 Torr to 400 Torr or in a range of 280 Torr to 350 Torr.

The temperature of the substrate 100 may also be controlled. In some embodiments, the substrate 100 is maintained at a temperature in a range of 400° C. to 600° C., in a range of 450° C. to 550° C., in a range of 400° C. to 500° C. or in a range of 500° C. to 600° C.

The gap fill material 210 and the super-conformal film 310 share some similar material properties. In some embodiments, the atomic ratio of germanium to oxygen is in a range of 0.2 to 1, in a range of 0.2 to 0.5, in a range of 0.5 to 1, in a range of 0.7 to 1 or in a range of 0.7 to 0.9.

Without being bound by theory, it is believed that the use of the second oxidant, as described above, increases the relative oxygen content of the germanium oxide material. Accordingly, the gap fill material 210 or the super-conformal film 310 deposited by the disclosed methods will have a relatively low atomic ratio of germanium to oxygen when a second oxidant is used.

One or more embodiment of the disclosure is directed to methods of removing or etching germanium oxide. In some embodiments, the germanium oxide is removed selectively. As used in this regard, a selective removal process is one in which a target material (e.g., germanium oxide) is removed more quickly than surrounding material. In some embodiments, the method for removing germanium oxide is selective to one or more of silicon oxide or silicon nitride. In some embodiments, the selectivity (etch rate of GeOx/etch rate of SiO or SiN) is greater than or equal to 10, greater than or equal to 20, greater than or equal to 50 or greater than or equal to 100.

In some embodiments, the method for removing germanium oxide comprises exposing germanium oxide to an aqueous solution. In some embodiments, the aqueous solution further comprises hydrogen peroxide ($H_2O_2$).

In some embodiments, the aqueous solution is acidic. In some embodiments, the aqueous solution comprises sulfuric acid ($H_2SO_4$). In some embodiments, the aqueous solution is basic. In some embodiments, the aqueous solution comprises one or more of NaOH or $NH_4OH$. In some embodiments, the aqueous solution consists essentially of 0.05 M NaOH.

In some embodiments, the aqueous solution is heated to facilitate removal of the germanium oxide. In some embodiments, the aqueous solution is heated to a temperature in a range of 60° C. to 100° C., in a range of 70° C. to 90° C., in a range of 65° C. to 75° C. or in a range of 85° C. to 95° C.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of selectively removing a gap fill material, the method comprising:
    depositing a germanium oxide super-conformal film in at least one feature on a substrate surface defining a surrounding material comprising silicon oxide or silicon nitride comprising sidewalls and a bottom, the at least one feature having an opening width and extending a depth into the substrate, the germanium oxide super-conformal film having a sidewall thickness $T_S$ on the sidewalls, a bottom thickness $T_B$ on the bottom and a top thickness $T_T$ on the substrate surface, and there is a ratio of $T_B$ to $T_T$ that is greater than or equal to 3;
    exposing the germanium oxide super-conformal film to an aqueous solution; and
    selectively removing the germanium oxide more quickly than the surrounding material.

2. The method of claim 1, wherein depositing the germanium oxide super-conformal film comprises exposing the substrate surface comprising the at least one feature to a precursor consisting essentially of germane and a first oxidant and forming in the at least one feature the germanium oxide super-conformal film, the germanium oxide super-conformal film having substantially no voids or seams, wherein the substrate surface is exposed to the first oxidant constantly and the precursor intermittently, and the method is performed without the use of plasma.

3. The method of claim 1, wherein the ratio of $T_B$ to $T_T$ is greater than or equal to 4, and a ratio between the depth and the opening width is in a range of 2 to 10.

4. The method of claim 1, wherein the selectively removing the germanium oxide is selective to the silicon oxide or silicon nitride.

5. The method of claim 4, wherein the selectively removing the germanium oxide occurs at an etch of rate of germanium oxide to silicon oxide of greater than or equal to 10.

6. The method of claim 4, wherein the selectively removing the germanium oxide occurs at an etch of rate of germanium oxide to silicon oxide of greater than or equal to 20.

7. The method of claim 4, wherein the selectively removing the germanium oxide occurs at an etch of rate of germanium oxide to silicon oxide of greater than or equal to 50.

8. The method of claim 4, wherein the selectively removing the germanium oxide occurs at an etch of rate of germanium oxide to silicon oxide of greater than or equal to 100.

9. The method of claim 4, wherein the selectively removing the germanium oxide occurs at an etch of rate of germanium oxide to silicon nitride of greater than or equal to 10.

10. The method of claim 4, wherein the selectively removing the germanium oxide occurs at an etch of rate of germanium oxide to silicon nitride of greater than or equal to 20.

11. The method of claim 4, wherein the selectively removing the germanium oxide occurs at an etch of rate of germanium oxide to silicon nitride of greater than or equal to 50.

12. The method of claim 4, wherein the selectively removing the germanium oxide occurs at an etch of rate of germanium oxide to silicon nitride of greater than or equal to 100.

13. The method of claim 4, wherein the aqueous solution further comprises hydrogen peroxide.

14. The method of claim 13, wherein the aqueous solution is acidic.

15. The method of claim 13, wherein the aqueous solution comprises sulfuric acid.

16. The method of claim 13, wherein the aqueous solution is basic.

17. The method of claim 16, wherein the aqueous solution comprises one or more of NaOH or $NH_4OH$.

18. The method of claim 4, wherein the aqueous solution is heated to a temperature in a range of 60° C. to 100° C.

19. The method of claim 18, wherein the aqueous solution is heated to a temperature in a range of 65° C. to 85° C.

20. The method of claim 18, wherein the aqueous solution is heated to a temperature in a range of 70° C. to 90° C.

* * * * *